United States Patent [19]

Isobe et al.

[11] Patent Number: 5,284,794
[45] Date of Patent: Feb. 8, 1994

[54] METHOD OF MAKING SEMICONDUCTOR DEVICE USING A TRIMMABLE THIN-FILM RESISTOR

[75] Inventors: Yoshihiko Isobe, Toyoake; Makio Iida, Ichinomiya; Shoji Miura, Anjo; Keizou Kajiura, Nagoya; Mikimasa Suzuki, Toyohashi; Masami Saito, Kariya, all of Japan

[73] Assignee: Nippondenso Co., Ltd., Kariya, Japan

[21] Appl. No.: 960,298

[22] Filed: Oct. 13, 1992

Related U.S. Application Data

[63] Continuation of Ser. No. 658,026, Feb. 21, 1991, abandoned.

[30] Foreign Application Priority Data

Feb. 21, 1990 [JP] Japan .................................. 2-40008

[51] Int. Cl.$^5$ ............................................. H01L 21/26
[52] U.S. Cl. ..................................... 437/173; 437/922; 437/918; 148/DIG. 136; 148/DIG. 55
[58] Field of Search ................. 357/51; 437/173, 195, 437/192, 922, 979, 918; 148/DIG. 136

[56] References Cited

U.S. PATENT DOCUMENTS

| | | | |
|---|---|---|---|
| 4,032,949 | 6/1977 | Bierig | 148/DIG. 55 |
| 4,069,487 | 1/1978 | Kasai et al. | |
| 4,217,570 | 8/1980 | Holmes | |
| 4,288,776 | 9/1981 | Holmes | |
| 4,468,414 | 8/1984 | Van Vonno | 357/49 |
| 4,594,265 | 6/1986 | Van Vonno et al. | 357/49 |
| 4,665,295 | 5/1987 | McDavid | |
| 4,701,241 | 10/1987 | Schlesier | 437/918 |
| 4,708,747 | 11/1987 | O'Mara, Jr. | 437/29 |
| 4,791,006 | 12/1988 | Galvagni et al. | 427/282 |
| 4,951,118 | 8/1990 | Nakamura | 357/51 |
| 5,096,850 | 3/1992 | Lippitt, III | 437/173 |
| 5,110,758 | 5/1992 | Baskett | 437/918 |

FOREIGN PATENT DOCUMENTS

350961 1/1990 European Pat. Off.
63-338 4/1987 Japan .................................. 437/922

OTHER PUBLICATIONS

IBM Technical Disclosure Bulletin, H. S. Bhatia, et al., "Process for Making High Performance Resistors", vol. 27, No. 1A, Jun., 1984, pp. 327–328.
Journal of Applied Physics, J. C. North, "Laser Vaporization of Metal Films-Effect of Optical Interference in Underlying Dielectric Layers", vol. 48, No. 6, Jun., 1977, pp. 2419–2423.
Thin Solid Films, "Laser Trimming of NiCr Thin Film Resistors I: Thin Film Resistors Without A Protective Layer", No. 1, 182, Dec. 20, 1989, Lausaunne, Switzerland, pp. 23–33.
Thin Solid Films, "Laser Trimming of NiCr Thin Film Resistors II: Thin Film Resistors With An SiO2 Protective Layer", No. 1, 182, Dec. 20, 1989, Lausaunne, Switzerland, pp. 35–45.
SPIE vol. 611 Laser Processing of Semiconductors and Hybrids (1986) pp. 70, 74, 75 by Mueller.

Primary Examiner—Brian E. Hearn
Assistant Examiner—Linda J. Fleck
Attorney, Agent, or Firm—Cushman, Darby & Cushman

[57] ABSTRACT

A semiconductor device has a thin-film resistor trimmed by laser. The semiconductor device comprises a semiconductor substrate having an element region that covers at least part of the surface of the semiconductor substrate, a first insulation film disposed on the surface of the semiconductor substrate, and a second insulation film disposed on the surface of the semiconductor substrate through an opening of the first insulation film. The opening is formed by selectively removing at least part of the first insulation film at a location on the surface of the semiconductor substrate where the element region is not involved. The thin-film resistor is formed on the second insulation film.

9 Claims, 6 Drawing Sheets

METHOD OF MAKING SEMICONDUCTOR DEVICE USING A TRIMMABLE THIN-FILM RESISTOR

This is a continuation of Ser. No. 07/658,026, filed on Feb. 21, 1991, abandoned.

BACKGROUND OF THE INVENTION

1. Field of the Invention

The present invention relates to a semiconductor device and a method for producing the same, and particularly to a semiconductor device having a thin-film resistor to be trimmed by laser and a method for producing this sort of semiconductor device.

2. Description of the Related Art

In an insulation film of a semiconductor device having an integrated circuit, there is arranged a metallic thin-film resistor. The thin-film resistor is fused at a predetermined location by laser beam to adjust the resistance value thereof.

FIG. 1 shows a conventional semiconductor device comprising an integrated circuit. In the figure, a field insulation film 50 is formed on the surface of a semiconductor substrate in a process in which a PN junction region for circuit elements is formed. A thin-film resistor 90 is formed on the field insulation film 50. Then, after a passivation film is formed on the thin-film resistor in the semiconductor device, the thin-film resistor 90 is irradiated with a laser beam through the passivation film to be trimmed by removing a part of the thin-film resistor.

A process of adjusting the resistance value of the thin-film resistor 90 is called laser trimming. An important thing for the laser trimming is to adjust a quantity of laser energy to be absorbed by the thin-film resistor 90 to an optimum level. If the absorbed energy is too little, the thin-film resistor will fuse insufficiently, and if it is excessive, the insulation film 50 and semiconductor substrate will be damaged.

SUMMARY OF THE INVENTION

Laser beams transmitted onto the thin-film resistor are partly reflected by the lower face of the thin-film resistor and by the surface of the semiconductor substrate, and the reflected beams interfere with other transmitted beams and are absorbed by the thin-film resistor. Also, the laser beams are reflected by the surface of the thin-film resistor and by the surface of a passivation film and interfere with one another, so that a total quantity of laser beams absorbed by the thin-film resistor depends on the thicknesses of the respective films. When the thickness of the insulation film disposed between the semiconductor substrate and the thin-film resistor changes, it has been noted that the quantity of energy absorbed by the thin-film resistor changes greatly depending on thickness of an underlying insulation layer. In order to control the film-thickness of the field insulation film, the inventors of the present invention tried various ways of controlling a thickness of the field insulation film to thereby solve several problems. However, they also met several problems each way they tried.

For example, when forming the thin-film resistor on a semiconductor substrate having an integrated circuit, it is necessary to control the thickness of the field insulation film as accurately as possible to prevent a change in the quantity of energy absorbed by the thin-film resistor. The field insulation film is, however, thick (usually 0.5 micrometer or greater), and thus the absolute value of a change occurring in the film thickness often becomes larger. The thickness of the field insulation film is also increased through various high-temperature processes carried out after the formation of the field insulation film, or is decreased through an etching process carried out after the formation of the field insulation film. Namely, the processes to be carried out before the thin-film resistor is formed on the field insulation film change the thickness of the field insulation film. It is, therefore, very difficult to control the thickness of the field insulation film.

In this method, since the film-thickness of the field insulation film is large, and the variation thereof is also large, it is difficult to obtain a preferable condition of the film.

Therefore, the quantity of the laser energy absorbed by the thin-film is varied, causing the resistor to be cracked or have a poorly cut portion.

It may be possible to actually measure the thickness of the field insulation film for every wafer or every lot and control the strength of laser beams. This, however, complicates the processes.

As mentioned before, when the thin-film resistor is formed on the semiconductor substrate having the integrated circuit, an emitted laser beam is partly absorbed by the surface of the semiconductor substrate to damage the same. Also, laser beams repeatedly reflected by respective interfaces may influence a region of the integrated circuit to change electrical characteristics such as a leakage current at a PN junction.

To solve the problems, an object of the present invention is to provide a semiconductor device having a laser-trimmed thin-film resistor of good yield and a method of producing the same.

According to one aspect of the present invention, there is provided a semiconductor device comprising a semiconductor substrate having an element region on its surface, a first insulation film disposed on the surface of the semiconductor substrate, a second insulation film disposed on the surface of the semiconductor substrate where the first insulation film is selectively removed, the thickness of the second insulation film being thinner than that of the first insulation film, a thin-film resistor disposed on the surface of the second insulation film, the resistance of the thin-film resistor being set by laser trimming, and a passivation film disposed on the surface of the thin-film resistor.

Another aspect of the present invention provides a method of producing a semiconductor device comprising the steps of forming a first insulation film on the surface of a semiconductor substrate, selectively removing the first insulation film and forming a second insulation film on the surface of the semiconductor substrate, the thickness of the second insulation film being thinner than that of the first insulation film, forming a thin-film resistor on the surface of the second insulation film, forming a passivation film on the surface of the thin-film resistor, and trimming the thin-film resistor by laser, thereby setting the resistance of the thin-film resistor.

DESCRIPTION OF THE PREFERRED EMBODIMENTS

A semiconductor device according to the present invention basically has the above-mentioned technical aspects. The first insulation film of the semiconductor device is preferably a field insulation film, and the second insulation film is, for example, a thermally-oxidized film such as a thermally-oxidized silicon film. Instead of the thermally-oxidized silicon film, the second insulation film may be a CVD-oxidized film. The thermally-oxidized silicon film is fine and it is easy to accurately control its thickness.

According to the preferred embodiment of the present invention, the thickness of the second insulation film is 0.1 micrometer or greater and thinner than the first insulation film. If the thickness of the second insulation film is thinner than 0.1 micrometer, fused and scattering particles of the thin-film resistor may break through the second insulation film to destroy insulation. If the thickness of the second insulation film is greater than that of the first insulation film, an absolute quantity of fluctuation of film thickness may become larger even if a rate of the fluctuation is constant.

According to experiments with a laser wavelength of 1.06 micrometers, it was found that an energy absorbing rate of the second insulation film made of a thermally-oxidized silicon film was good when its film thickness was in a range from about 0.1 to 0.3 micrometer.

According to the present invention, an existing first insulation film such as a field insulation film of a semiconductor device is selectively removed to expose the surface of a semiconductor substrate where a second insulation film is to be formed to have a film thickness thinner than that of the first insulation film.

This arrangement can reduce fluctuations of the second insulation film, and selecting an optimum thickness of the second insulation film can adjust energy to be absorbed by a thin-film resistor formed on the second insulation film. Consequently, the arrangement can reduce a quantity of laser radiation, thereby reducing energy absorbed by peripheral areas such as the semiconductor substrate, and preventing a withstand voltage of the second insulation film and the electric characteristics of adjacent circuit elements such as a leakage current value of a PN junction from deteriorating.

A sequence of processes of producing the semiconductor device according to the present invention will be explained with reference to FIGS. 2 to 8 in which a thin-film resistor and a bipolar transistor are integrated together.

Figure 1:
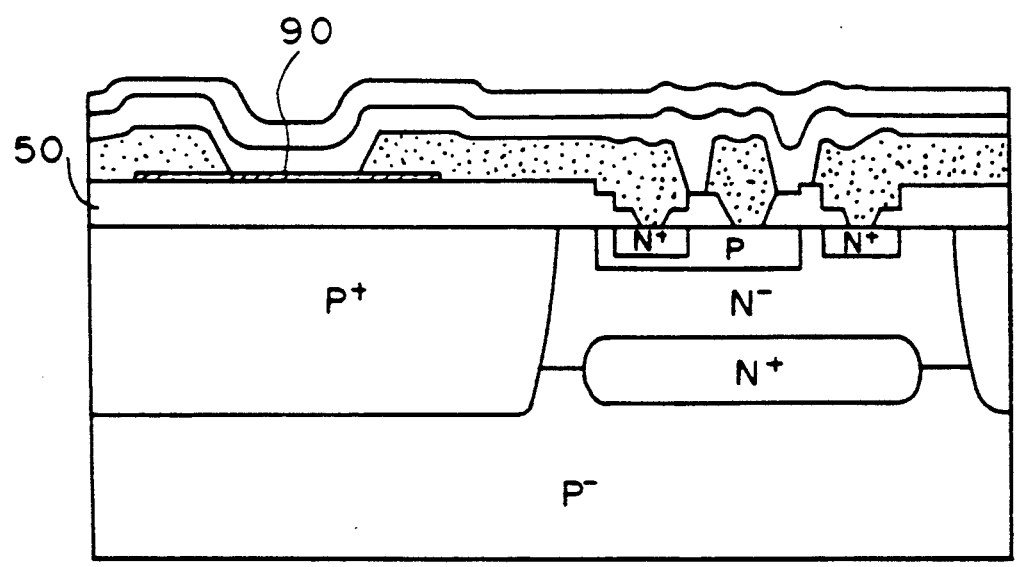
FIG. 1 is a sectional view showing a semiconductor device having a thin-film resistor according to a prior art.
Figure 2:
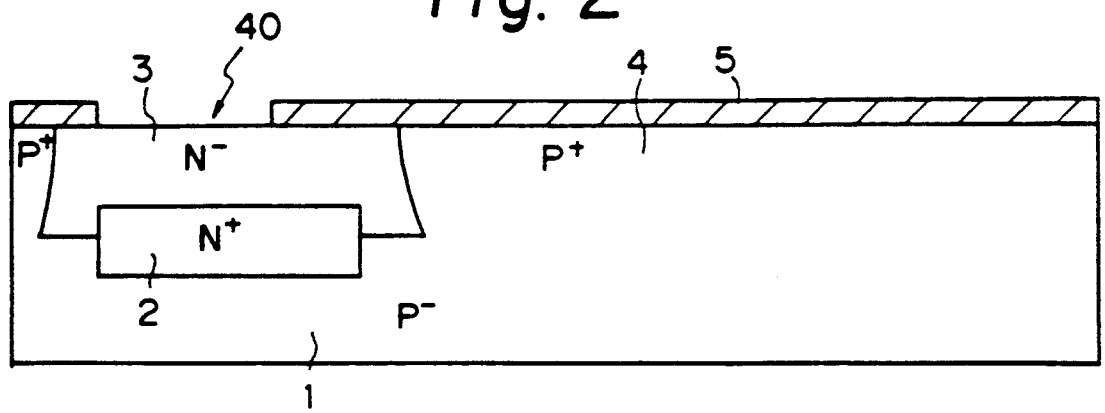
FIGS. 2 to 8 are views showing a sequence of processes of producing a semiconductor device according to the present invention, in which FIG. 8 particularly shows an example of the semiconductor device of the present invention.

Firstly, on a crystal plane (111) of a P− silicon substrate 1, there are formed an N+ buried diffusion region 2, an N− epitaxial layer 3, and a P+ isolation region 4 according to a known method in which, for example, Sb is partially diffused in a part of a P-type silicon substrate to form an embedded N+ type diffusion region 2 then an N− epitaxial layer 3 is epitaxially grown in a Si atmosphere including P therein and after that, B is selectively diffused in the substrate to form a P+ type isolation region 4. A silicon oxide film, etc., (not shown) on the surface of the silicon substrate 1 are entirely removed, and a silicon oxide film 5 serving as a field insulation film is formed according to a thermal oxidation method to a thickness of 0.6 micrometer. The silicon oxide film 5 is selectively removed to form an opening 40 as shown in FIG. 2.

Figure 3:
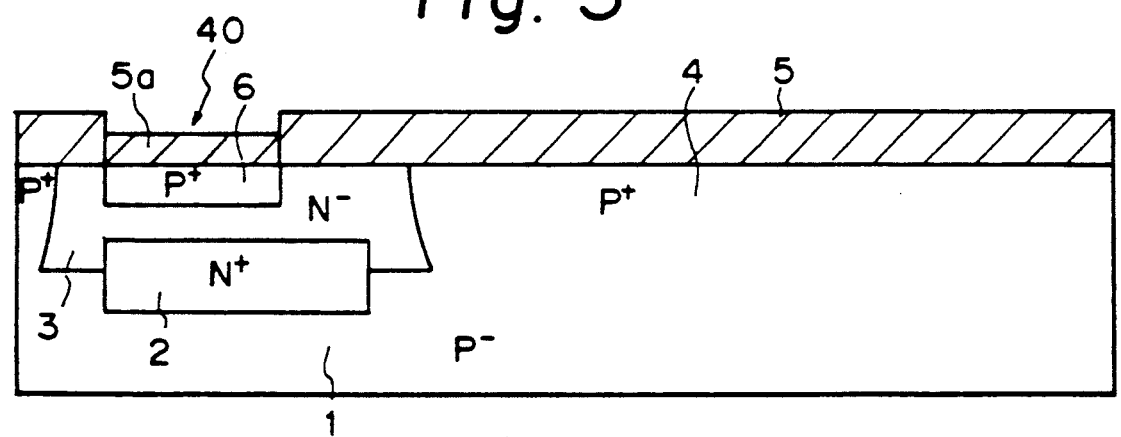

Boron is ion-implanted through the opening 40, and then utilizing a CVD method, a silicon oxide film 5a serving as the field insulation film is formed in the opening 40 to a thickness of 6000 angstroms thereafter the material is heat-treated in an atmosphere of $O_2$ and $N_2$ to form a P+ diffusion region (base region) 6 as shown in FIG. 3.

In this process, when a new silicon oxide film 5a is formed, the silicon oxide film 5 which is previously formed on the surface of the substrate has a thickness of 1.2 μm.

Figure 4:
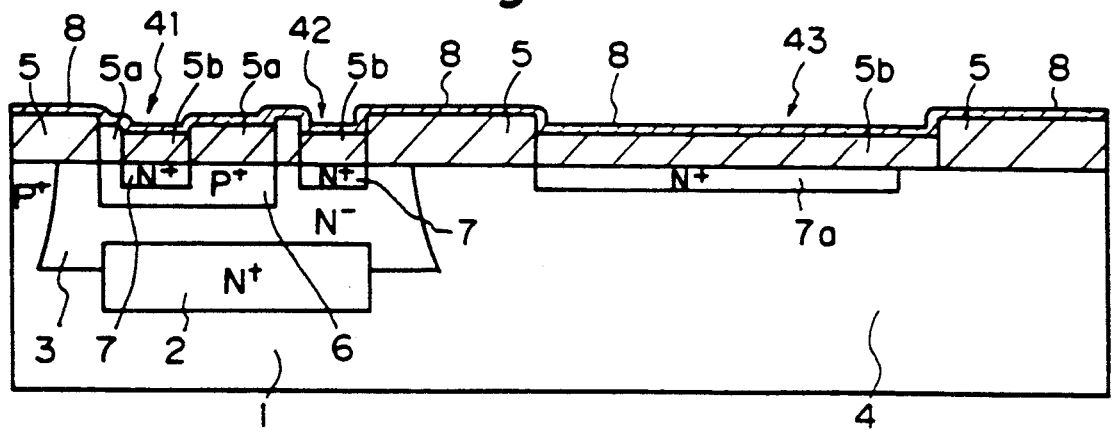

Predetermined regions 41, 42, and 43 are opened through the silicon oxide films 5 and 5a, and phosphorus is doped in a diffusion furnace with $POCl_2$ serving as an impurity source. The material is then heat-treated in an atmosphere of $O_2$ and $N_2$ to form N+ diffusion regions (emitter and collector regions) 7, an N+ diffusion region 7a, a silicon oxide film 5b and a PSG film 8 as shown in FIG. 4. The PSG film 8 forms part of the field insulation film.

Figure 5:
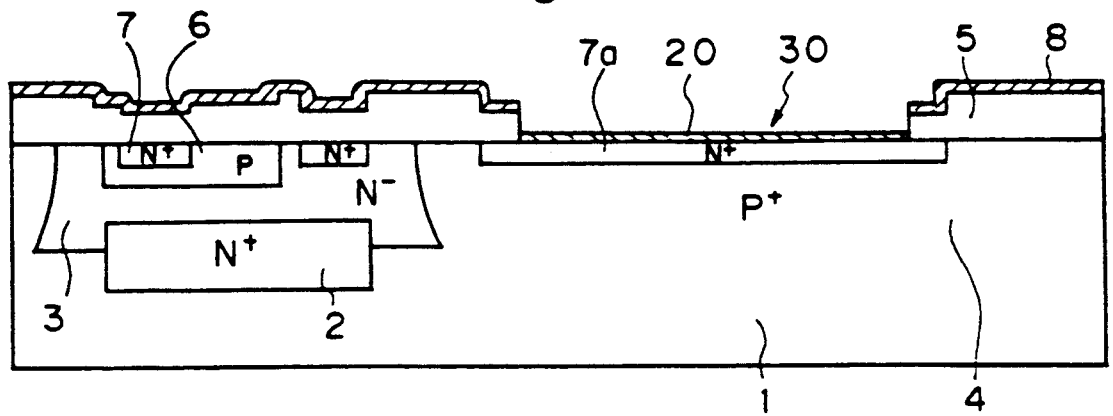

An opening 30 is formed at a predetermined position of the field insulation film 5 where a thin-film resistor 9 is to be formed. In an oxidizing atmosphere in a diffusion furnace, a silicon oxide film (the second insulation film of the present invention) 20 is formed in the opening 30 as shown in FIG. 5. The reason why the opening 30 is formed at the N+ diffusion layer 7a is to simultaneously form capacitors between the N+ diffusion layer 7a and aluminum wiring and between the N+ diffusion layer 7a and the thin-film resistor.

A Cr-Si layer is deposited using a sputtering method with a target including Cr and Si therein, RF-power of 280 W and Ar flow-rate of 30 secM in 5 m Torr and selectively etched utilizing a photolithographic method and wet etching method to form the thin-film resistor 9 of 150 angstroms in thickness on the thermally-oxidized silicon film. Further, contact holes 5c are formed through the silicon oxide films 5a and 5b and the PSG film 8 as shown in FIG. 6.

Figure 7:
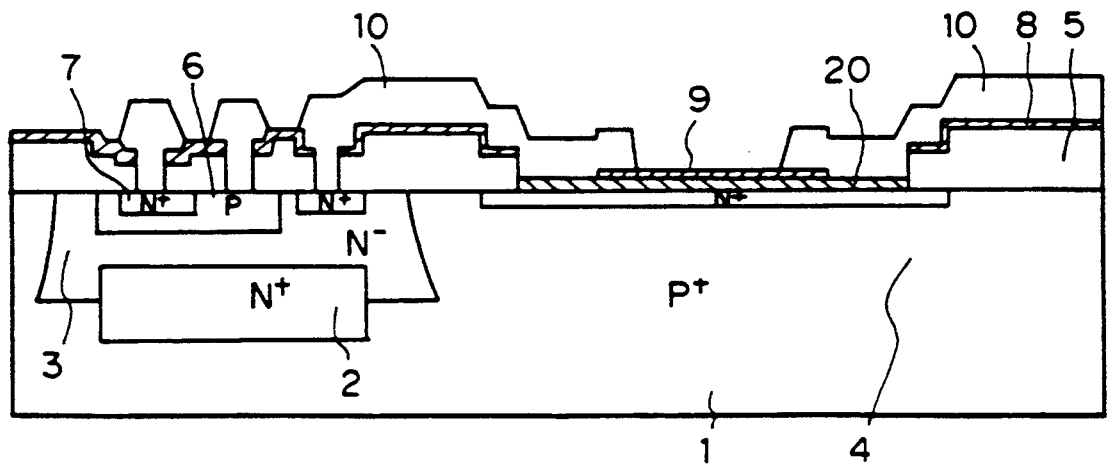

An aluminum wiring layer 10 is formed according to the sputtering method, selectively etched to remove unnecessary parts to form a predetermined pattern, and sintered in $H_2N_2$ forming gas for 30 minutes at 450° C. The aluminum wiring layer 10 electrically connects the collector region of a bipolar transistor to the thin-film resistor 9 as shown in FIG. 7.

Figure 8:
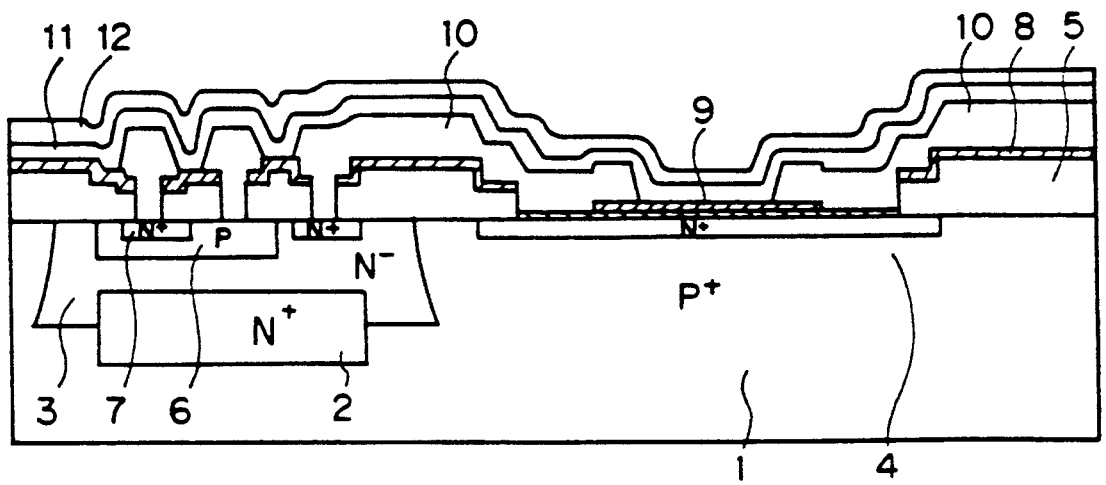

A PSG film (the passivation film of the present invention) 11 is formed using an atmospheric pressure CVD method or plasma CVD method to a thickness of 0.4 micrometer. Thereafter, a silicon nitride film (the passivation film of the present invention) 12 is formed according to the plasma CVD method to a thickness of 0.5 micrometer as shown in FIG. 8. The semiconductor device thus produced has a passivation film comprising a silicon nitride film 12 and PSG film 11 and the resistance value can be trimmed by irradiating a YAG pulse laser on a thin-film resistor made of a Cr-Si film through the passivation film, to cause a part of the resistor to be melted and dispersed.

Figure 6:
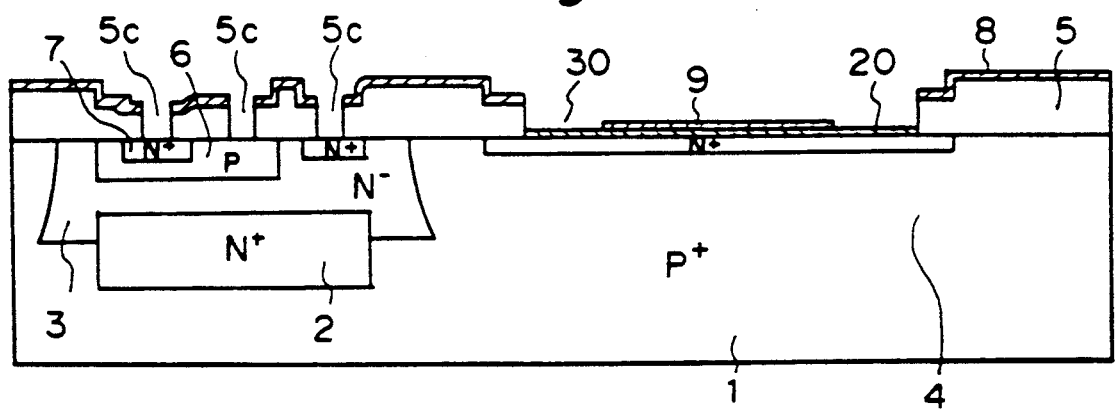

As explained above, the thickness of the second insulation film produced according to the embodiment is determined by the thermal oxidation process of the silicon substrate 1 as shown in FIG. 6, so that the film thickness may be controllable very easily. For example, a film thickness of 2000 angstroms that is appropriate for trimming the thin-film resistor can be formed with an allowance of less than plus or minus 100 angstroms.

The thickness of the thermally-oxidized silicon film 20 is selected to reduce laser trimming energy to as small as possible. Namely, the thickness of the film 20 is selected to increase the energy absorption rate of the thin-film resistor 9. If the laser radiation energy can be reduced, it is possible to reduce a quantity of energy to be absorbed by the silicon substrate.

Figure 9:
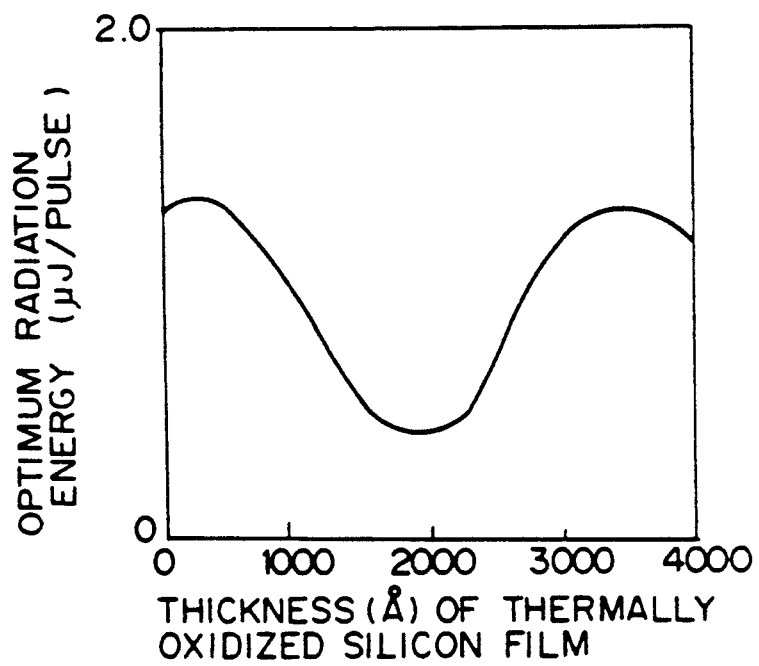
FIGS. 9 to 11 are characteristic curves showing relations between film thicknesses and laser radiation energy of semiconductor devices produced according to the present invention.

FIG. 9 shows a relationship between film thickness of the thermally-oxidized silicon film 20 and optimum quantity of radiation energy necessary for trimming the thin-film resistor 9 of the semiconductor device produced according to the method of the present invention. It is understood from the figure that the optimum radiation energy is minimal when the film thickness is about 0.2 micrometer.

Figure 10:
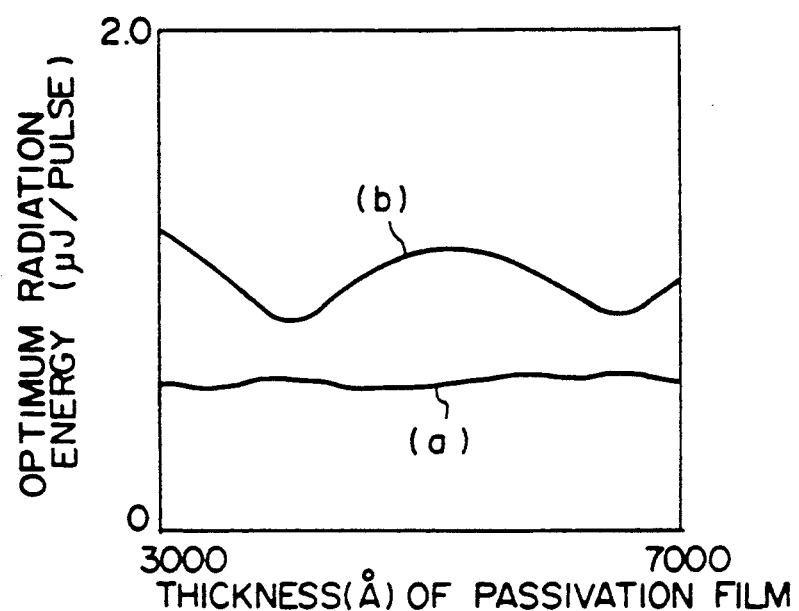

FIG. 10 shows a relationship between thicknesses of the passivation films 11 and 12 and optimum radiation energy quantities. In FIG. 10, a curve (a) is for the thermally-oxidized silicon film 20 having a thickness of 0.20 plus or minus 0.02 micrometer, and a curve (b) is for the thermally-oxidized silicon film 20 having a thickness of 0.28 micrometer.

As is apparent in FIG. 10, when the thermally-oxidized silicon film 20 is 0.20 plus or minus 0.02 micrometer in thickness, an influence of fluctuations in the thicknesses of the passivation films 11 and 12 is substantially negligible. When the thickness of the thermally-oxidized silicon film 20 is less than 0.10 micrometer, the thin-film resistor 9 may disperse by about 1000 angstroms in thickness at the time of laser trimming. This is not preferable. If the film thickness is substantially equal to that of the field insulation film, it is also not preferable because a long oxidation time is needed which has a negative influence circuit elements and deteriorates film thickness controllability.

Oxidizing conditions of the silicon film 20 must be determined by considering the film thickness controllability, oxidized film growing speed, and influence on the diffusion layer. A preferable technique is a wet oxidation method carried out in a temperature range from 800 to 1000 degrees centigrade, more preferably at a temperature of 860 degrees centigrade.

As an oxidized film forming method for a Cr-Si base layer, any kind of film forming method having a capability of performance to form an oxidized film having a thickness of about 2000±200 Å, by which a superior evenness of the film thickness and a superior controlling ability of the film thickness can be obtained, can be used to this process.

Under the present circumstances, a thermal oxidizing method can provide such superior evenness of the film thickness and a superior controlling ability of the film thickness.

Nevertheless, this method is hardly applied to the present invention since under the method as mentioned above, i.e., a dry oxidizing method, a film forming speed is generally slow naturally to require a treatment under a high temperature or prolonged treatment.

On the other hand, a wet oxidizing method is considered to be the most suitable oxidizing method to the present invention, since the oxidized film forming speed under the wet oxidizing method, is faster than that of the dry oxidizing method and the oxidized film in the wet oxidizing method can be formed under a relatively lower temperature and in shorter period than that of the dry oxidizing method.

Further, even under a conventional CVD method, a $SiO_2$ film which is deposited and formed by a LPCVD method under a low pressure (for example, 1 to 10 Torr) and at a high temperature (for example, 800° to 1000° C.), has a superior film thickness controlling ability and a superior film thickness and thus it can be used as an oxidized film forming method in the present invention.

Figure 11:
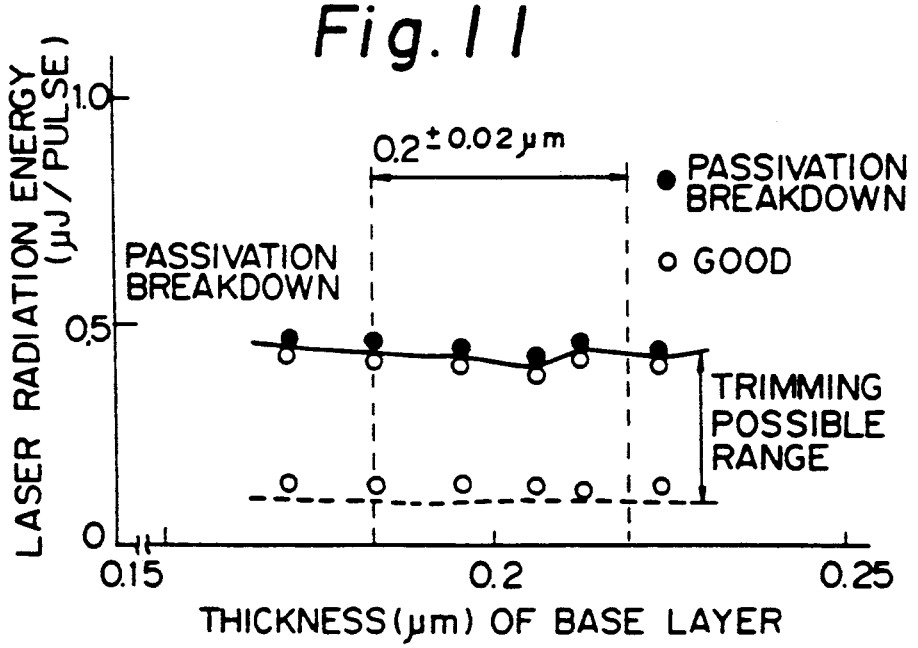

FIG. 11 is a view showing a relationship between laser pulse energy for enabling trimming and thickness of the thermally-oxidized silicon film 20.

Figure 12:
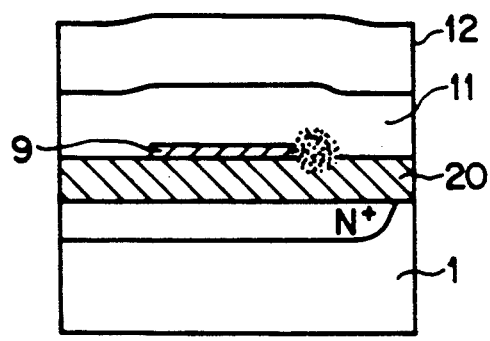
FIG. 12 shows a semiconductor device that has been trimmed in accordance with the present invention.

In the present invention, when the thin-film resistor 9 is trimmed by utilizing a pulse laser, a cut portion is naturally formed on a part of the thin-film resistor 9 causing the cross-sectional area thereof to be reduced or the width thereof to be narrowed and further, an area in which components of the thin-film resistor 9 are dispersed, is formed in the vicinity of the cut portion. Namely, the cut-end portion of the thin-film resistor formed by the laser trimming operation has a configuration such that the cross-sectional area thereof is smaller than that of the remaining portion of the thin-film resistor. A part of the components of the thin-film resistor is dispersed into at least one of the second insulation film and the passivation film, both provided in the vicinity of the cut-end portion. This is shown in FIG. 12.

A range of the laser pulse energy for enabling trimming, i.e., the maximum and minimum values of the laser pulse energy for enabling trimming are substantially constant when the thickness of the thermally-oxidized silicon film 20 is in a range of 0.2 plus or minus 0.02 micrometer. With this range of thickness, stabilized laser trimming can be done.

In the above embodiment, the thin-film resistor 9 is formed over the N+ diffusion region 7a. The position of the thin-film resistor 9 is optional if it is insulated from the silicon substrate.

The thin-film resistor 9 may be made of resistance material such as Cr-Si and Ni-Cr.

The second insulation film may be not only the thermally-oxidized silicon film 20 but also a CVD-oxidized silicon film.

In the above embodiment, the laser is a YAG (Yttrium, Aluminum, Garnet) pulse laser having a wavelength of 1.06 micrometers. This wavelength is optional according to the present invention. For example, a YLF (Yttrium, Lithium, Fluorine) laser having a wavelength of 1.047 micrometers can be employed. Namely, a wavelength in a range from 1.047 to 1.06 micrometers is usable.

When YAG pulse laser is used, the wave form as shown in FIG. 9 which is obtained when YLF pulse laser is used, is slightly shifted parallely to a direction to which the thickness of the film is reduced, by around 100 Å.

Therefore, a most suitable film thickness formed utilizing the YAG pulse laser is 1900±200 Å.

As explained above, according to a semiconductor device and a method of producing the same of the present invention, a first insulation film is formed on a semiconductor substrate having circuit elements. The first insulation film is selectively removed to form a second insulation film that is thinner than the first insulation film. A thin-film resistor is formed on the surface of the second insulation film. This arrangement can remarkably reduce fluctuations in the thickness of the second insulation film, thereby reducing fluctuations in energy absorbed by the thin-film resistor.

The present invention can, therefore, solve the problems of inferior fusion of the thin-film resistor and the cracking of the insulation film, thereby remarkably improving yield.

For example, when the first insulation film is a field insulation film, the second insulation film on which the thin-film resistor is to be formed is formed after selectively removing the first insulation film and exposing the surface of the semiconductor substrate, so that the formation of the second insulation film may never require complicated processes such as those required in forming the first insulation film. This drastically reduces fluctuations of the thickness of the insulation film and fluctuations of energy absorbed by the thin-film resistor. The thickness of the second insulation film may be so set to improve a laser energy absorption rate of the thin-film resistor and to reduce the influence of other factors such as passivation films that affect the laser absorption rate, thereby stably trimming the thin-film resistor by laser.

A thin-film resistor produced by the process of the present invention has a configuration such that it has a cut-end portion and a cross-sectional area thereof is smaller than that of the rest portion of the thin film resistor and at least a portion of components of the thin film resistor are dispersed into at least one of the second insulation film and the passivation film which contacts to a vicinity of the cut-end portion of the thin film resistor causing to make an area in the resistor in a vicinity of the cut-end portion, in which an amount of the components of the thin film resistor is reduced.

We claim:

1. A method of producing a semiconductor device, comprising the steps of:
    forming a first insulation film on the surface of a semiconductor substrate;
    selectively removing the first insulation film and forming a second insulation film on the surface of the semiconductor substrate, the thickness of the second insulation film being thinner than that of the first insulation film;
    forming a thin-film resistor on the surface of the second insulation film;
    forming a passivation film on the surface of the thin-film resistor; and
    trimming the thin-film resistor by laser, thereby setting a resistance value of the thin-film resistor.

2. A method as set forth in claim 1, wherein proper semiconductor elements are formed on the surface of the semiconductor substrate in advance.

3. A method as set forth in claim 1, wherein said thin-film resistor is mainly made of Cr-Si or Ni-Cr.

4. A method as set forth in claim 1, wherein said second insulation film is a thermally-oxidized film.

5. A method as set forth in claim 1, wherein the thickness of said second insulation film is in a range from 0.1 to 0.3 micrometer.

6. A method as set forth in claim 1, wherein the thickness of said second insulation film is 0.2 plus or minus 0.02 micrometer.

7. A method as set forth in claim 1, wherein said second insulation film is formed according to a wet oxidation method.

8. A method as set forth in claim 1, wherein a wavelength of the laser used for trimming the thin-film resistor is in a range from 1.047 to 1.06 micrometers.

9. A method as set forth in claim 1, wherein the laser is a YAG pulse laser or a YLF pulse laser.

* * * * *